US 8,571,498 B2

(12) United States Patent
Khlat (10) Patent No.: US 8,571,498 B2
(45) Date of Patent: Oct. 29, 2013

(54) MULTI-MODE/MULTI-BAND POWER MANAGEMENT SYSTEM

(75) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 61 days.

(21) Appl. No.: 13/188,024

(22) Filed: Jul. 21, 2011

(65) Prior Publication Data

US 2012/0049953 A1    Mar. 1, 2012

Related U.S. Application Data

(60) Provisional application No. 61/376,787, filed on Aug. 25, 2010.

(51) Int. Cl.
*H04B 1/04* (2006.01)

(52) U.S. Cl.
USPC .................................. 455/127.3; 455/127.1

(58) Field of Classification Search
USPC ............... 455/102, 108, 127.1–127.5, 114.3
See application file for complete search history.

(56) References Cited

U.S. PATENT DOCUMENTS

| | | | |
|---|---|---|---|
| 4,996,500 A | 2/1991 | Larson et al. | |
| 5,311,309 A | 5/1994 | Ersoz et al. | |
| 5,351,087 A | 9/1994 | Christopher et al. | |
| 5,414,614 A | 5/1995 | Fette et al. | |
| 5,420,643 A | 5/1995 | Romesburg et al. | |
| 5,486,871 A | 1/1996 | Filliman et al. | |
| 5,532,916 A | 7/1996 | Tamagawa | |
| 5,581,454 A | 12/1996 | Collins | |
| 5,646,621 A | 7/1997 | Cabler et al. | |
| 5,715,526 A | 2/1998 | Weaver, Jr. et al. | |
| 5,822,318 A | 10/1998 | Tiedemann, Jr. et al. | |
| 5,898,342 A | 4/1999 | Bell | |
| 5,905,407 A | 5/1999 | Midya | |
| 5,936,464 A | 8/1999 | Grondahl | |

(Continued)

FOREIGN PATENT DOCUMENTS

EP        0755121 A2    1/1997
EP        1492227 A1    12/2004

(Continued)

OTHER PUBLICATIONS

International Search Report for PCT/US2012/023495 mailed May 7, 2012, 13 pages.

(Continued)

*Primary Examiner* — Ping Hsieh
*Assistant Examiner* — Xin Jia
(74) *Attorney, Agent, or Firm* — Withrow & Terranova, P.L.L.C.

(57) ABSTRACT

A power management system for a radio frequency (RF) power amplifier (PA) load is disclosed. The power management system includes a first switching power supply that is adapted to output a relatively constant voltage, an electronic switch for selectively coupling the first switching power supply to the RF PA load, and a second switching power that is adapted to output a dynamic DC voltage to the RF PA load. The power management system further includes a control system that is adapted to close the electronic switch to supply the relatively constant DC voltage in addition to the dynamic DC voltage to the RF PA load in a first mode and to open the electronic switch wherein the relatively constant DC voltage is not supplied to the RF PA load in a second mode.

36 Claims, 7 Drawing Sheets

(56) References Cited

U.S. PATENT DOCUMENTS

| | | | |
|---|---|---|---|
| 6,043,610 A | 3/2000 | Buell | |
| 6,043,707 A | 3/2000 | Budnik | |
| 6,055,168 A | 4/2000 | Kotowski et al. | |
| 6,070,181 A | 5/2000 | Yeh | |
| 6,118,343 A * | 9/2000 | Winslow | 330/295 |
| 6,141,541 A | 10/2000 | Midya et al. | |
| 6,147,478 A | 11/2000 | Skelton et al. | |
| 6,198,645 B1 | 3/2001 | Kotowski et al. | |
| 6,204,731 B1 | 3/2001 | Jiang et al. | |
| 6,256,482 B1 | 7/2001 | Raab | |
| 6,300,826 B1 | 10/2001 | Mathe et al. | |
| 6,348,780 B1 | 2/2002 | Grant | |
| 6,559,689 B1 | 5/2003 | Clark | |
| 6,617,930 B2 | 9/2003 | Nitta | |
| 6,621,808 B1 | 9/2003 | Sadri | |
| 6,624,712 B1 | 9/2003 | Cygan et al. | |
| 6,658,445 B1 | 12/2003 | Gau et al. | |
| 6,681,101 B1 | 1/2004 | Eidson et al. | |
| 6,690,652 B1 | 2/2004 | Sadri | |
| 6,701,141 B2 | 3/2004 | Lam | |
| 6,728,163 B2 | 4/2004 | Gomm et al. | |
| 6,819,938 B2 | 11/2004 | Sahota | |
| 6,995,995 B2 | 2/2006 | Zeng et al. | |
| 7,058,373 B2 | 6/2006 | Grigore | |
| 7,164,893 B2 | 1/2007 | Leizerovich et al. | |
| 7,233,130 B1 | 6/2007 | Kay | |
| 7,411,316 B2 | 8/2008 | Pai | |
| 7,528,807 B2 | 5/2009 | Kim et al. | |
| 7,529,523 B1 | 5/2009 | Young et al. | |
| 7,539,466 B2 | 5/2009 | Tan et al. | |
| 7,595,569 B2 | 9/2009 | Amerom et al. | |
| 7,609,114 B2 | 10/2009 | Hsieh et al. | |
| 7,615,979 B2 | 11/2009 | Caldwell | |
| 7,627,622 B2 | 12/2009 | Conrad et al. | |
| 7,646,108 B2 | 1/2010 | Paillet et al. | |
| 7,696,735 B2 | 4/2010 | Oraw et al. | |
| 7,724,837 B2 | 5/2010 | Filimonov et al. | |
| 7,773,691 B2 | 8/2010 | Khlat et al. | |
| 7,777,459 B2 | 8/2010 | Williams | |
| 7,782,036 B1 | 8/2010 | Wong et al. | |
| 7,805,115 B1 | 9/2010 | McMorrow et al. | |
| 7,859,336 B2 * | 12/2010 | Markowski et al. | 330/136 |
| 7,907,010 B2 | 3/2011 | Wendt et al. | |
| 7,994,864 B2 | 8/2011 | Chen et al. | |
| 8,000,117 B2 | 8/2011 | Petricek | |
| 8,008,970 B1 | 8/2011 | Homol et al. | |
| 8,068,622 B2 | 11/2011 | Melanson et al. | |
| 8,081,199 B2 | 12/2011 | Takata et al. | |
| 8,093,951 B1 | 1/2012 | Zhang et al. | |
| 8,164,388 B2 | 4/2012 | Iwamatsu | |
| 8,174,313 B2 | 5/2012 | Vice | |
| 8,198,941 B2 | 6/2012 | Lesso | |
| 8,204,456 B2 | 6/2012 | Xu et al. | |
| 2002/0071497 A1 | 6/2002 | Bengtsson et al. | |
| 2003/0017286 A1 | 1/2003 | Williams et al. | |
| 2003/0031271 A1 | 2/2003 | Bozeki et al. | |
| 2003/0062950 A1 | 4/2003 | Hamada et al. | |
| 2003/0137286 A1 | 7/2003 | Kimball et al. | |
| 2003/0206603 A1 | 11/2003 | Husted | |
| 2003/0220953 A1 | 11/2003 | Allred | |
| 2003/0232622 A1 | 12/2003 | Seo et al. | |
| 2004/0047329 A1 | 3/2004 | Zheng | |
| 2004/0124913 A1 | 7/2004 | Midya et al. | |
| 2004/0196095 A1 | 10/2004 | Nonaka | |
| 2004/0219891 A1 | 11/2004 | Hadjichristos | |
| 2004/0266366 A1 | 12/2004 | Robinson et al. | |
| 2004/0267842 A1 | 12/2004 | Allred | |
| 2005/0008093 A1 | 1/2005 | Matsuura et al. | |
| 2005/0032499 A1 | 2/2005 | Cho | |
| 2005/0047180 A1 | 3/2005 | Kim | |
| 2005/0064830 A1 | 3/2005 | Grigore | |
| 2005/0093630 A1 * | 5/2005 | Whittaker et al. | 330/254 |
| 2005/0122171 A1 | 6/2005 | Miki et al. | |
| 2005/0156662 A1 | 7/2005 | Raghupathy et al. | |
| 2005/0157778 A1 | 7/2005 | Trachewsky et al. | |
| 2006/0128324 A1 | 6/2006 | Tan et al. | |
| 2006/0178119 A1 | 8/2006 | Jarvinen | |
| 2006/0181340 A1 | 8/2006 | Dhuyvetter | |
| 2006/0244513 A1 | 11/2006 | Yen et al. | |
| 2007/0014382 A1 | 1/2007 | Shakeshaft et al. | |
| 2007/0024360 A1 | 2/2007 | Markowski | |
| 2007/0183532 A1 | 8/2007 | Matero | |
| 2007/0259628 A1 * | 11/2007 | Carmel et al. | 455/127.1 |
| 2008/0044041 A1 | 2/2008 | Tucker et al. | |
| 2008/0081572 A1 | 4/2008 | Rofougaran | |
| 2008/0150619 A1 | 6/2008 | Lesso et al. | |
| 2008/0205095 A1 | 8/2008 | Pinon et al. | |
| 2008/0242246 A1 | 10/2008 | Minnis et al. | |
| 2008/0252278 A1 | 10/2008 | Lindeberg et al. | |
| 2008/0280577 A1 | 11/2008 | Beukema et al. | |
| 2009/0004981 A1 | 1/2009 | Eliezer et al. | |
| 2009/0097591 A1 | 4/2009 | Kim | |
| 2009/0167260 A1 | 7/2009 | Pauritsch et al. | |
| 2009/0174466 A1 | 7/2009 | Hsieh et al. | |
| 2009/0190699 A1 | 7/2009 | Kazakevich et al. | |
| 2009/0218995 A1 | 9/2009 | Ahn | |
| 2009/0289720 A1 | 11/2009 | Takinami et al. | |
| 2009/0319065 A1 | 12/2009 | Risbo | |
| 2010/0017553 A1 | 1/2010 | Laurencin et al. | |
| 2010/0171553 A1 | 7/2010 | Okubo et al. | |
| 2010/0301947 A1 | 12/2010 | Fujioka et al. | |
| 2010/0308654 A1 | 12/2010 | Chen | |
| 2010/0311365 A1 | 12/2010 | Vinayak et al. | |
| 2010/0321127 A1 | 12/2010 | Watanabe et al. | |
| 2011/0018626 A1 | 1/2011 | Kojima | |
| 2011/0084760 A1 | 4/2011 | Guo et al. | |
| 2011/0148375 A1 | 6/2011 | Tsuji | |
| 2011/0235827 A1 | 9/2011 | Lesso et al. | |
| 2012/0034893 A1 | 2/2012 | Baxter et al. | |
| 2012/0068767 A1 * | 3/2012 | Henshaw et al. | 330/127 |
| 2012/0133299 A1 | 5/2012 | Capodivacca et al. | |
| 2012/0139516 A1 | 6/2012 | Tsai et al. | |
| 2012/0170334 A1 | 7/2012 | Menegoli et al. | |
| 2012/0176196 A1 | 7/2012 | Khlat | |
| 2012/0236444 A1 | 9/2012 | Srivastava et al. | |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006073208 A1 | 7/2006 |

OTHER PUBLICATIONS

Hekkala, A. et al., "Adaptive time misalignment compensation in envelope tracking amplifiers," International Symposium on Spread Spectrum Techniques and Applications, Aug. 2008, pp. 761-765.

Invitation to Pay Additional Fees and Where Applicable Protest Fee for PCT/US2012/024124 mailed Jun. 1, 2012, 7 pages.

Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

International Search Report for PCT1US2011/061007 mailed Aug. 16, 2012, 16 pages.

International Search Report for PCT/US2012/024124 mailed Aug. 24, 2012, 14 pages.

International Search Report for US PCT/US2012/036858 mailed Aug. 9, 2012, 7 pages.

International Search Report for US PCT/US2012/036858 mailed Aug. 10, 2012, 8 pages.

(56) References Cited

OTHER PUBLICATIONS

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
Extended European Search Report for application 06740532.4 mailed Dec. 7, 2010, 7 pages.
International Search Report for PCT/US06/12619 mailed May 8, 2007, 2 pages.
International Search Report for PCT/US2011/061009 mailed Feb. 8, 2012, 14 pages.
Invitation to Pay Additional Fees and Where Applicable Protest Fee for PCT/US2011/061007 mailed Feb. 13,2012, 7 pages.
Choi, J. et al., "A New Power Management IC Architecture for Envelope Tracking Power Amplifier," IEEE Transaction on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.
International Search Report for PCT/US2011/064255 mailed Apr. 3, 2012, 12 pages.
International Search Report for PCT/US2011/044857, mailed Oct. 24, 2011, 10 pages.
International Search Report for PCT/US11/033037, mailed Aug. 9, 2011, 10 pages.
International Search Report for PCT/US11/49243, mailed Dec. 22, 2011, 9 pages.
Final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
Unknown, "Nujira files 100th envelope tracking patent," CS: Compound Semiconductor, Apr. 11, 2011, 1 page.
Dixon, "Standardization boosts momentum for Envelope tracking," mwee.com, Apr. 20, 2011, 2 pages.
Sahu, et al., "Adaptive Power Management of Linear RF Power Amplifiers in Mobile Handsets—An Integrated System Design Approach," Paper in press, 2004, 4 pages.
Kim et al., "High Efficiency and Wideband Envelope Tracking Power Amplifiers with Sweet Spot Tracking," 2010 IEEE Radio Frequency Integrated Circuits Symposium, 2010, pp. 255-258.
Le, et al., "A 32nm Fully Integrated Reconfigurable Switched-Capacitor DC-DC Convertor Delivering 0.55W/mm2 at 81% Efficiency," 2010 IEEE International Solid State Circuits Conference, 2010, pp. 210-212.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Patent Application 13/222,453 mailed Dec. 6, 2012, 13 pages.
International Preliminary Report on Patentability for PCT/US2011/033037 mailed Oct. 23, 2012, 7 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Preliminary Report on Patentability for PCT/US2011/044857 mailed Mar. 7, 2013, 6 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
International Search Report and Written Opinion for PCT/US2012/062070, mailed Jan. 21, 2013, 12 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
International Preliminary Report on Patentability for PCT/US2011/064255, mailed Jun. 20, 2013, 7 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Notice of Allowance for U.S. Appl. No. 13/222,484, mailed Aug. 26, 2013, 8 pages.
Notice of Allowance for U.S. Appl. No. 13/550,060, mailed Aug. 16, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.

* cited by examiner

FIG. 7 ively large, being around 2 μF in order to meet GMSK spectrum requirements. An integration of the ripple current flowing through the inductor LGMSK/LINEAR divided by the

MULTI-MODE/MULTI-BAND POWER MANAGEMENT SYSTEM

RELATED APPLICATIONS

This application claims the benefit of provisional patent application Ser. No. 61/376,787, filed Aug. 25, 2010, the disclosure of which is hereby incorporated herein by reference in its entirety.

FIELD OF THE DISCLOSURE

The present disclosure relates to a power management system that is usable to control power supplying multi-mode/multi-band power amplifiers.

BACKGROUND

Multi-mode/multi-band power amplifiers (PAs) are designed to amplify radio frequency (RF) signals that may operate in second generation (2G) wireless access networks that use Gaussian minimum shift keying (GMSK) and enhanced data GSM evolution (EDGE) modulation protocols. Third generation (3G) wireless access networks that use high speed packet access (HSPA) and enhanced high speed packet access (HSPA+) modulation protocols may also be amplified by multi-mode/multi-band PAs. Further still, fourth generation (4G) wireless access networks that use long term evolution frequency division duplex (LTE FDD) and time division duplex (TDD) may also be amplified by multi-mode/multi-band PAs. Other dedicated transmit chain amplifiers are used to support extra bands that operate with a single mode. These dedicated transmit chain amplifiers are sometimes referred to as "bolt-on" PAs. For example, a bolt-on amplifier could be used to support 4G specific bands that are outside the bands that are compatible with an individual multi-mode/multi-band PA.

Figure 1:
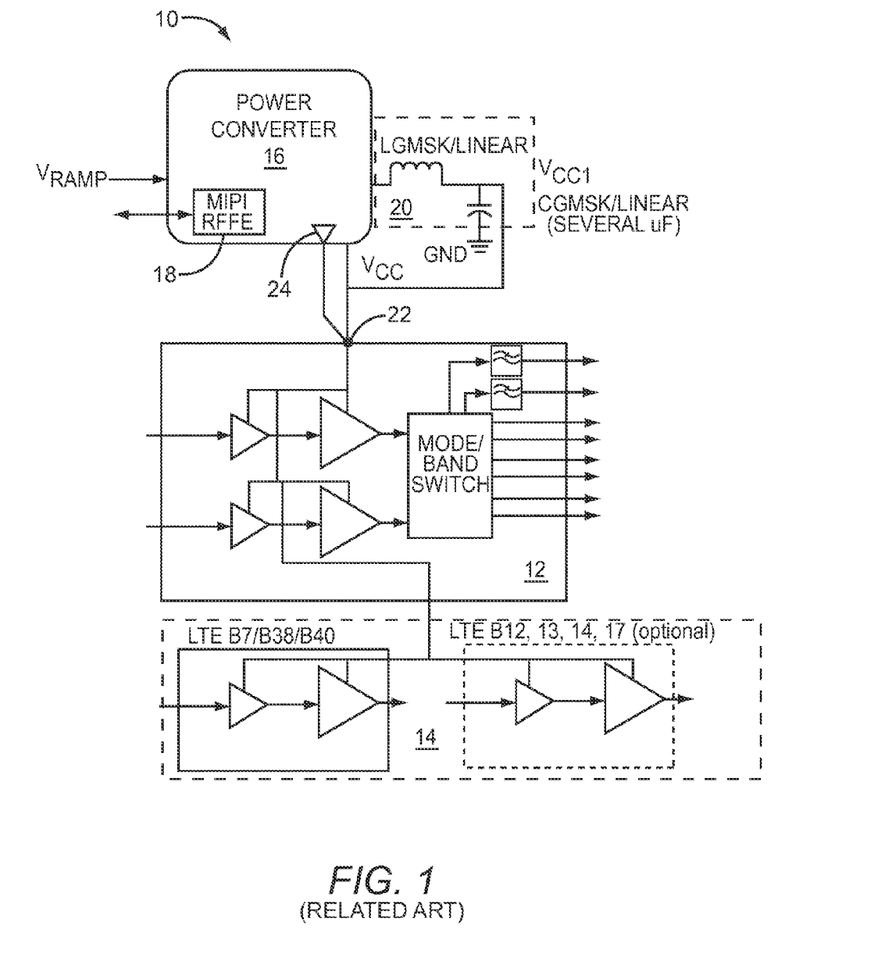
FIG. 1 is a block diagram of a related art power management system that includes a multi-mode/multi-band power amplifier (PA), and bolt-on PAs.

FIG. 1 is a block diagram of a related art power management system 10 for a multi-mode/multi-band PA 12 and bolt-on PAs 14, all of which are powered by a single power converter 16. The power converter 16 also includes a serial interface 18 that sends and receives data and receives commands for controlling the power management system 10. A typical serial interface is a mobile industry processor interface (MIPI) for communicating with a radio frequency front end (RFFE).

An output filter 20 is coupled between the power converter 16 and a power node 22 for both the multi-mode/multi-band PA 12 and the bolt-on PAs 14. The output filter 20 is an LC type filter that includes an inductor LGMSK/LINEAR that is coupled between the power converter 16 and the power node 22. Also, a capacitor CGMSK/LINEAR is coupled between the inductor LGMSK/LINEAR and ground GND.

The power management system 10 provides power to the multi-mode/multi-band PA 12 for a saturated amplifier mode used to amplify GMSK modulated signals. When GMSK signals are being amplified by the multi-mode/multi-band PA 12, a slow DC-DC mode of the power converter 16 provides a constant direct current (DC) voltage output. In order to meet GMSK requirements that limit a magnitude of ripple current flowing through the inductor LGMSK/LINEAR, an inductance value for the inductor LGMSK/LINEAR is relatively large, ranging from around 1 μH to 2 μH. Moreover, a capacitance value for the capacitor CGMSK/LINEAR is relatively large, being around 2 μF in order to meet GMSK spectrum requirements. An integration of the ripple current flowing through the inductor LGMSK/LINEAR divided by the capacitance value of the capacitor CGMSK/LINEAR provides a value for an undesirable ripple voltage that appears across the power node 22 to ground GND. In order to reduce this undesirable ripple voltage, either a large inductance value for the inductor LGMSK/LINEAR is needed or a larger capacitance value for the capacitor CGMSK/LINEAR is needed. Alternately, a high switching frequency for the power converter 16 can be used.

The power management system 10 must also provide power to the multi-mode/multi-band PA 12 and the bolt-on PAs 14 when they are operated in a linear amplifier mode used to amplify signals for 3G and 4G operation. Since the linear amplifier mode is typically less efficient than the saturated amplifier mode, envelope tracking is employed wherein the power converter 16 outputs a supply voltage $V_{CC}$ that is amplitude modulated in synchronization with the amplitude of a signal that is to be amplified by a PA of either the multi-mode/multi-band PA 12 or the bolt-on PAs 14. In this way, efficient operation of the multi-mode/multi-band PA 12 and the bolt-on PAs 14 is increased as the supply voltage follows the amplitude of the signal to be amplified. A power control signal known as $V_{RAMP}$ received by the power converter 16 carries envelope tracking information that is used by a parallel amplifier 24 to control the amplitude modulation of the supply voltage $V_{CC}$, which is typically on the order of 3V peak-to-peak (pkpk).

A problem arises when operation in envelope tracking mode in that the parallel amplifier 24 will have to provide the relatively large voltage modulation of 3Vpkpk across the capacitor CGMSK/LINEAR that serves as a large decoupling capacitor during the saturated amplifier mode. The problem is that a relatively large modulation current $I_{BYPASS}$ is demanded from the parallel amplifier 24 in order to satisfy the following relationship that assumes a 10 MHz modulation of the supply voltage $V_{CC}$.

$$I_{BYPASS} = CGMSK/\text{LINEAR} * dV_{CC}/dt = 2\ \mu F * 3Vpkpk * 10\ \text{MHz} = 60A$$

In actuality, the modulation current $I_{BYPASS}$ is lower than 60A since the amplitude modulation provided by the parallel amplifier 24 is typically only around 1 MHz to 5 MHz. Nevertheless, the modulation current $I_{BYPASS}$ remains unacceptably large.

Figure 2:
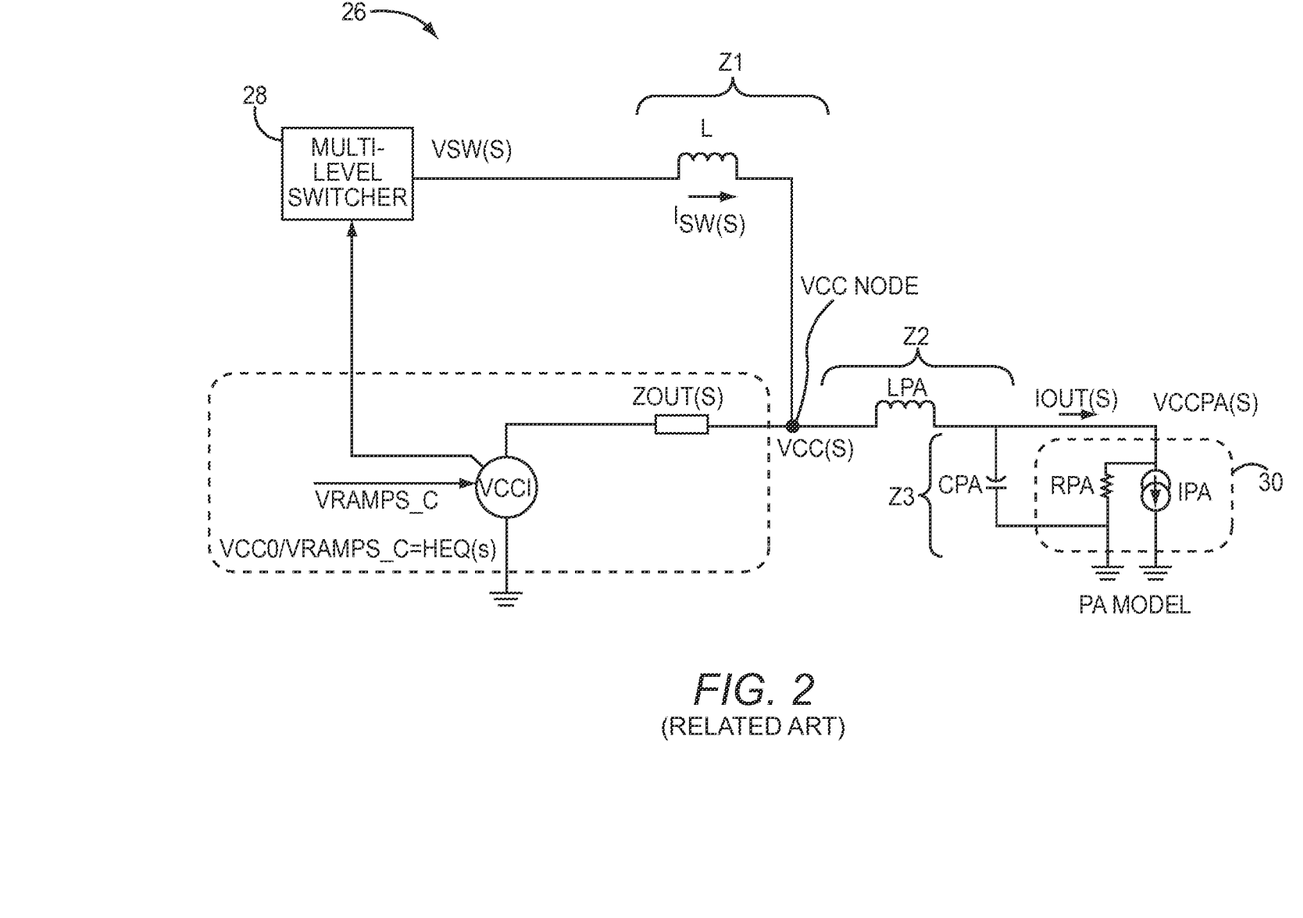
FIG. 2 is a schematic diagram of a system model that is usable to derive a transfer function for the related art system of FIG. 1.

FIG. 2 is a schematic diagram of a system model 26 that is usable to derive a transfer function for the power management system 10 of FIG. 1. The system model 26 includes a multi-level switcher 28 that is controlled by a source voltage $V_{CCI}$ that is responsive to a power control signal $V_{RAMPS\_C}$ that equals the power control signal $V_{RAMP}$ without pre-distortion. The system model 26 also includes a PA model 30 that represents a PA under the control of the power management system 10. A resistance $R_{PA}$ in parallel with a current source $I_{PA}$ models a response of the PA to an output current $I_{OUT(S)}$. A voltage $V_{CCPA}$ is developed across the PA in response to the output current $I_{OUT(S)}$.

An output voltage $V_{CC0}$ represents an output voltage $V_{CC}$ versus the power control signal $V_{RAMP}$ when a switching current $I_{SW(S)}$ output from the multi-level switcher 28 is equal to zero. A transfer function $HEQ_{(S)} = V_{CC0}/V_{RAMPS\_C}$ when the switching current $I_{SW(S)}$ output from the multi-level switcher 28 is equal to zero. Extra decoupling capacitors located within the PA are represented in the PA model 30 as a decoupling capacitor $C_{PA}$. Extra parasitic inductance that results from layout routing of a power line from a $V_{CC}$ node to the PA is represented by a parasitic inductor $L_{PA}$.

During operation in the envelope tracking mode for LTE, an inductor value for the inductor LGMSK/LINEAR (FIG.

1), and represented by L should be lowered to around 0.5 μH to allow the multi-level switcher 28 to quickly provide current through the inductor LGMSK/LINEAR. In this way, a slew rate limitation is avoided. For example, a current $I_{SW(S)}$ through the inductor LGMSK/LINEAR, and represented by L has a current rate of change $dI_{SW}/dt$ that is given by the following equation.

$$dI_{SW}/dt = (V_{SW} - V_{CC})/(LGMSK/LINEAR)$$

As a result, the current rate of change $dI_{SW}/dt$ is limited by an amount of available headroom $V_{SW} - V_{CC}$, which is usually increased by a value of inductance for the inductor LGMSK/LINEAR. A lower inductance value for LGMSK/LINEAR will result in a higher current rate of change $dI_{SW}/dt$. Thus, care must be taken not to lower the inductance value for LGMSK/LINEAR such that an instantaneous switching frequency of the switcher is required to be increased.

A more detailed analysis of the power management system 10 can be achieved by considering the various impedances that are represented in the system model 26. For example, an impedance Z1 is made up of the model inductor L that represents the impedance of the inductor LGMSK/LINEAR. An impedance Z2 represents optional filtering components and parasitic inductance between an output of the parallel amplifier 24 (FIG. 1) and a PA represented by the PA model 30. An impedance Z3 is primarily made up of the parasitic inductance $L_{PA}$ in parallel with the decoupling capacitor $C_{PA}$ coupled the resistance $R_{PA}$. An impedance $Z_{OUT}$ represents the impedance of the parallel amplifier 24 in parallel with a decoupling capacitor located on the $V_{CC}$ node.

The following equations are derived from the system model 26 shown in FIG. 2.

$$V_{CC}/V_{CC0} = (Z1/(Z1+Z_{OUT}))*(Z2+Z3)/(Z2+Z3+Z_{OUT}*Z1/(Z_{OUT}+Z1))$$

$$V_{CCPA}/V_{CC0} = (Z1/(Z1+Z_{OUT}))*(Z3/(Z2+Z3+Z_{OUT}*Z1/(Z_{OUT}+Z1))$$

$$V_{CC}/V_{SW} = (Z_{OUT}/(Z1+Z_{OUT}))*(Z2+Z3)/(Z2+Z3+Z_{OUT}*Z1/(Z_{OUT}+Z1))$$

$$V_{CCPA}/V_{SW} = (Z_{OUT}/(Z1+Z_{OUT}))*(Z3/(Z2+Z3+Z_{OUT}*Z1/(Z_{OUT}+Z1))$$

A computer simulation of the system model 26 starts with $V_{RAMPS\_C}$ set to zero, which forces $V_{CC0}$ equal to zero. In this way, the slow DCDC mode for saturated amplifier operation such as needed with GSMK is simulated. A typical inductance value for the impedance Z1 is set to about 1 μH, and a decoupling capacitance value for $Z_{OUT}$ is set to around 2.2 μF for simulating the slow DCDC mode.

Figure 3:
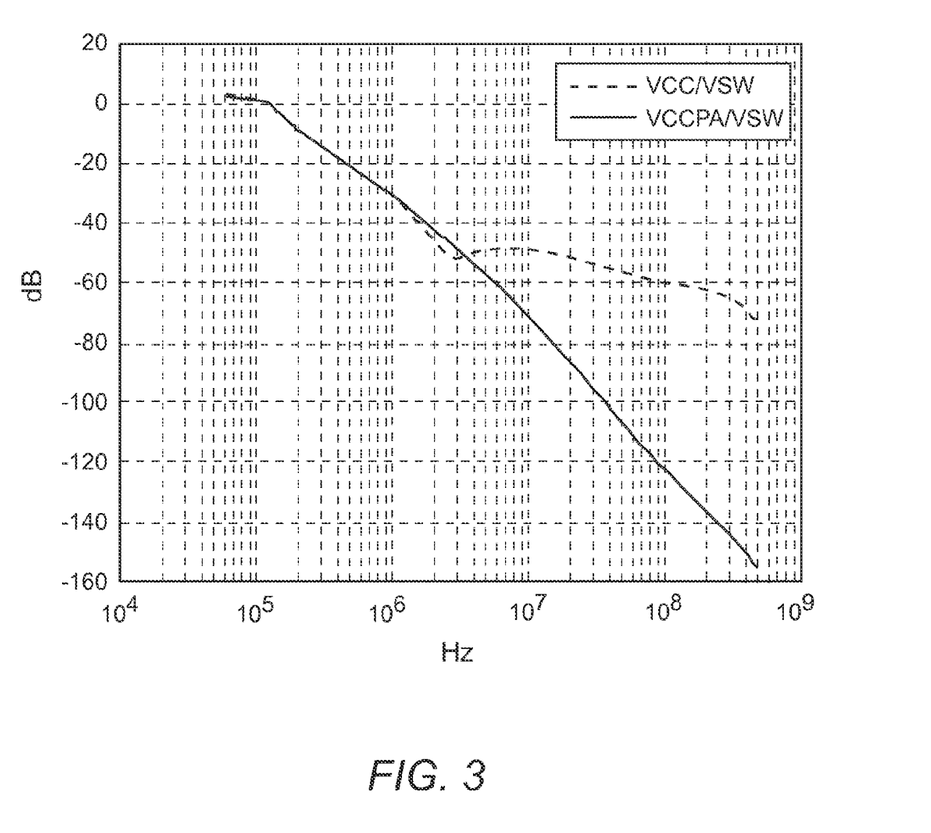
FIG. 3 is a frequency response graph for a slow-DCDC mode that uses relatively large inductor and capacitor values while the system of FIG. 1 powers a multi-mode/multi-band PA that amplifies a GMSK signal.

FIG. 3 is a frequency response graph for computer simulation results for the slow-DCDC mode that uses the relatively large inductance value of about 1 μH and the relatively large capacitance value of 2.2 μF. The frequency response graph confirms that there are conflicting needs to have a relatively large inductance value and a relatively large decoupling capacitance value for the slow DCDC mode, and a relatively small inductance value and a relatively small capacitance value for the envelope tracking mode. As a result of these conflicting needs, the related art power management system 10 (FIG. 1) cannot effectively supply power to the multi-mode/multi-band PA 12 (FIG. 1) and the bolt-on PAs 14 (FIG. 1) that includes PAs that operate in a saturated mode and that includes PAs that operate in a linear mode.

One related art attempt at solving this conflict is to have a pair of switched inductor and capacitor filter branches that have inductances and capacitances matched to the two different modes of operation. However, the related art switched inductor and capacitor filter branches include series electronic switches that have on state resistance values that lower the quality Q of any filtering provided by the switched inductor and capacitor filter branches. Thus the filtering achieved is not effective enough to pass spectrum requirements. Therefore, a need remains for a power management system that supplies power to a multi-mode/multi-band RF PA load that includes PAs that operate in a saturated mode and that includes PAs that operate in a linear mode.

SUMMARY

The present disclosure provides a power management system for a radio frequency (RF) power amplifier (PA) load. In general, the power management system of the present disclosure supplies power to a multi-mode/multi-band RF PA load that includes PAs that operate in a saturated mode and that includes PAs that operate in a linear mode. When the RF PA load operates in the saturated mode, the power management system provides a slow DC-DC mode that supplies a relatively constant direct current (DC) voltage output that has selectable constant power levels. Alternately, when the RF PA load operates in the linear mode, the power management system takes advantage of envelope tracking of a transmit signal to be amplified or pseudo envelope following when the transmit signal is pre-distorted. For example, when the RF PA load is operating in the linear mode, the power management system provides a dynamic DC voltage that is amplitude modulated in synchronization with the amplitude of the transmit signal that is to be amplified by the RF PA load.

In one embodiment, the power management system includes a first switching power supply that is coupled to an electronic switch for selectively coupling the first switching power supply to the RF PA load. A second switching power supply is continually coupled to the RF PA load. A control system is provided for closing the electronic switch to supply the relatively constant DC voltage in addition to the dynamic DC voltage to the RF PA load in a first mode, and for opening the electronic switch wherein the relatively constant DC voltage from the first switching power supply is not supplied to the RF PA load in the second mode. In another embodiment, a first output filter is coupled between the first switching power supply and the electronic switch, and a second output filter is coupled between the second switching power supply and the RF PA load. In at least one embodiment, the first output filter and the second output filter are both LC type filters.

The first switching power supply is adapted to output the relatively constant DC voltage based upon an expected power output. Alternately, the second switching power supply outputs the dynamic DC voltage that is amplitude modulated in synchronization with the amplitude of a signal that is to be amplified by the RF PA load. As a result of the relatively constant DC voltage of the first switching power supply, the first output filter has relatively large inductance and capacitance values. In contrast, due to the relatively large and dynamic amplitude modulation of the dynamic DC voltage supplied by the second switching power supply, the inductance and capacitance values of the second output filter are relatively small.

Operation of the power management system of the present disclosure involves a step of closing the electronic switch to supply a constant DC voltage in addition to the dynamic DC voltage to the RF PA load operating in the first mode. Another step provides for opening the electronic switch to remove the relatively constant DC voltage from the RF PA load in the second mode. In one embodiment, the first mode is saturation mode and the second mode is linear mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 4:
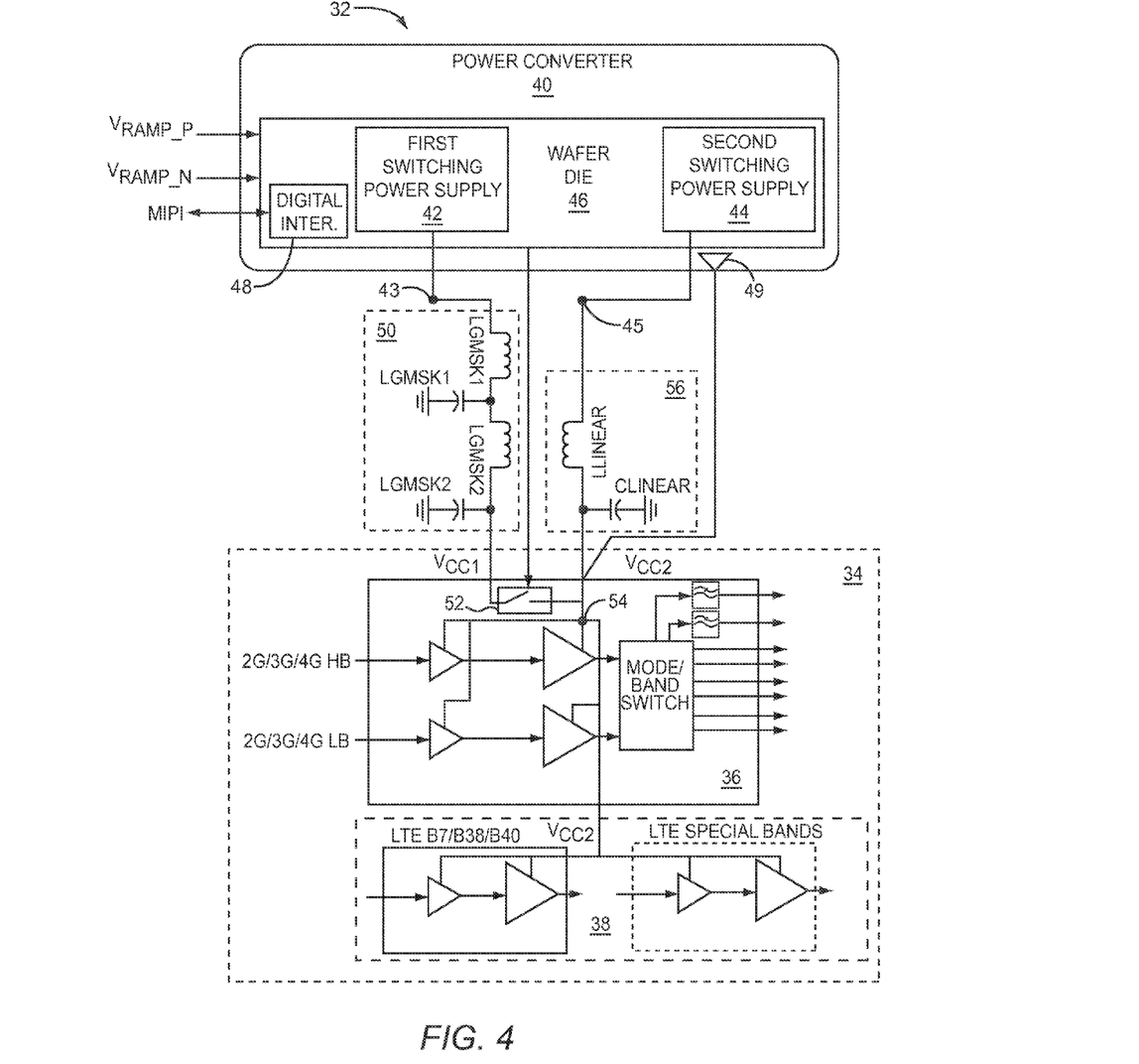
FIG. 4 is a block diagram of a multi-mode/multi-band power management system that is in accordance with the present disclosure.

FIG. 4 depicts a power management system 32 for supplying power to a power amplifier (PA) load 34 that includes PAs that operate in a saturated mode for one type of transmission and a linear mode for another type of transmission. As shown in FIG. 4, a multi-mode/multi-band PA 36 making up a portion of the RF PA load 34 is for amplifying RF signals that require either a PA operating in saturation mode or a PA operating in linear mode. For example, the multi-mode/multi-band PA 36 accepts second generation 2G high-band (HB) and low-band (LB) RF signals that require the PAs of the multi-mode/multi-band PA 36 to operate in a saturation mode. Gaussian minimum shift keying (GMSK) is a form of modulation used in 2G modulation schemes. Since data in GMSK modulation is based upon phase only, a PA with the multi-mode/multi-band PA 36 may be operated entirely in saturation mode. In contrast, 3G and 4G modulation schemes included in a long term evolution (LTE) standard rely on linear mode operation. Therefore, when transmission of LTE signals is required the PAs of the multi-mode/multi-band PA 36 may entirely operate in a linear mode. The linear mode of operation is also called for during RF signal transmissions that use the bolt on PAs 38 that are dedicated to special bands that are outside operational boundaries for the multi-mode/multi-band PA 36.

The power management system 32 includes a power converter 40 having a first switching power supply 42 with a output terminal 43 and a second switching power supply 44 with an output terminal 45. The first switching power supply 42 and the second switching power supply 44 are integrated into a single wafer die 46. In at least one embodiment, the first switching power supply 42 and the second switching power supply 44 are both a buck/boost type power supply that can be commanded to output a voltage that is less than a source voltage in a buck mode or output a voltage that is greater than the source voltage in a boost mode.

The power converter 40 also includes a digital interface 48 that sends and receives data and receives commands for controlling the power management system 32. In one embodiment, the digital interface 48 is a mobile industry processor interface (MIPI). The power converter 40 further includes differential terminals $V_{RAMP\_P}$, and $V_{RAMP\_N}$ for receiving a power control signal known as $V_{RAMP}$. A parallel amplifier 49 responds to the power control signal $V_{RAMP}$ applied to the differential terminals $V_{RAMP\_P}$ and $V_{RAMP\_N}$ by amplitude modulating the output voltage of the second switching power supply 44 in synchronization with the amplitude of a signal that is to be amplified by the RF PA load 34.

A first output filter 50 is coupled to the first switching power supply 42 via the output terminal 43. The first output filter 50 is an inductor-capacitor (LC) filter for reducing output ripple voltage that is a component of a constant DC voltage output from the first switching power supply 42. In one embodiment, the first output filter 50 includes a first inductor LGMSK1 coupled between the first switching power supply 42 and a first capacitor CGMSK1 coupled to a fixed voltage node such as ground GND. This embodiment also includes a second inductor LGMSK2 coupled between the first inductor LGMSK1 and a second capacitor CGMSK2 that is coupled to the fixed voltage node. Preferably, the first inductor LGMSK1 has an inductance value of several μH, while the first capacitor has a capacitance value of several μF. For example, the first inductor LGMSK1 typically has an inductance value on the order of 1 μH to 10 μH, and the first capacitor CGMSK1 typically has a capacitance value that ranges from about 1 μF to 10 μF. In contrast, the inductance value of the second inductor LGMSK2 and the capacitance value of the second capacitor CGMSK2 are significantly smaller. For example, the second inductor LGMSK2 typically has an inductance value that ranges from about 1 nH to 10 nH, and the second capacitor CGMSK2 typically has a capacitance value that ranges from about 1 nF to 10 nF.

An electronic switch 52 has a throw coupled to both the second capacitor CGMSK2 and the second inductor LGMSK2. A pole of the electronic switch 52 is coupled to a power supply node 54 of the PA load 34. The electronic switch 52 is switched on and off via a control signal that is output from the power converter 40. In one embodiment, the control signal for switching on and off the electronic switch 52 is transmitted to the power converter 40 over the digital interface 48. The electronic switch 52 can be realized in the form of a field effect transistor (FET), wherein the throw of the electronic switch is the source terminal of the FET, the control signal is coupled to the gate of the FET, and the drain of the FET serves as the pole of electronic switch 52.

A second output filter 56 coupled to the output terminal 45 of the second switching power supply is continuously coupled between the second switching power supply 44 and the power supply node 54 of the PA load 34. The second output filter 56 is an LC type filter for reducing output ripple voltage that is a component of a dynamic voltage output from the second switching power supply 44. In one embodiment, the second output filter 56 includes an inductor LLINEAR coupled between the second switching power supply 44 and the power supply node 54 of the PA load 34. A capacitor CLINEAR is coupled between the inductor LLINEAR and a fixed voltage node such as ground GND. Preferably, the inductor LLINEAR has an inductance value of a few nH, while the CLINEAR capacitor has a capacitance value of a few nF. For example, the inductor LLINEAR has an inductance value that ranges from about 1 nH to 10 nH, and the first capacitor CLINEAR has a capacitance value that ranges from about 1 nF to 10 nF.

In operation, and in anticipation of a transmission of an RF signal via a PA operating in saturation mode, the electronic switch 52 is closed in response to a command passed through the digital interface 48. In this way, a PA of the RF PA load 34 operating in saturation mode is supplied with the relatively constant DC voltage that is appropriate for a selected power level. For example, the power management system 32 may output a relatively constant DC voltage of 0.5V for a selected low power level, and the power management system 32 may output a relatively constant DC voltage of 5.0V for a selected high power level. In at least one embodiment, the selected power level for the PA operating in saturation mode is indicated via data transferred over the digital interface 48.

Alternately, in anticipation of a transmission of an RF signal via a linear mode, the electronic switch 52 is opened in response to a command passed through the digital interface 48. In this way, a PA of the RF PA load 34 operating in linear mode is supplied with a dynamic DC voltage that is amplitude modulated in synchronization with the amplitude of a signal that is to be amplified by the RF PA load 34 while the relatively constant DC voltage is not supplied to the RF PA load 34. In one embodiment, the power control signal $V_{RAMP}$ is digitally extracted from an envelope signal at baseband. The envelope signal is used to amplitude modulate the RF signal to be amplified by the PA of the RF PA load 34 operating in linear mode.

An exemplary process of generating the power control signal $V_{RAMP}$ begins with digitally sampling in-phase (I) and quadrature (Q) samples from the envelope signal. The digital I/O samples are also scaled by a gain value appropriate for a desired signal power level to be transmitted. The I/O samples can also be pre-distorted via values in a pre-distortion look-up table (LUT) in order to further linearize operation of the PA of the RF PA load 34 operating in linear mode. The I/O samples are ultimately converted from digital samples to an analog signal that makes up the power control signal $V_{RAMP}$, which in turn is applied to the terminals $V_{RAMP\_P}$ and $V_{RAMP\_N}$ as a differential signal. A positive attribute of this process of generating the $V_{RAMP}$ signal is that this process allows for some latency time to perform additional digital processing since the envelope signal is sampled at baseband before the RF signal to be amplified arrives at a PA of the RF PA load 34. The above exemplary process of generating the power control signal $V_{RAMP}$ is referred to as envelope following because the power control signal $V_{RAMP}$ includes pre-distortion components. However, another process of generating the power control signal $V_{RAMP}$ is known as envelope tracking if pre-distortion components are not included in the power control signal $V_{RAMP}$.

Figure 5:
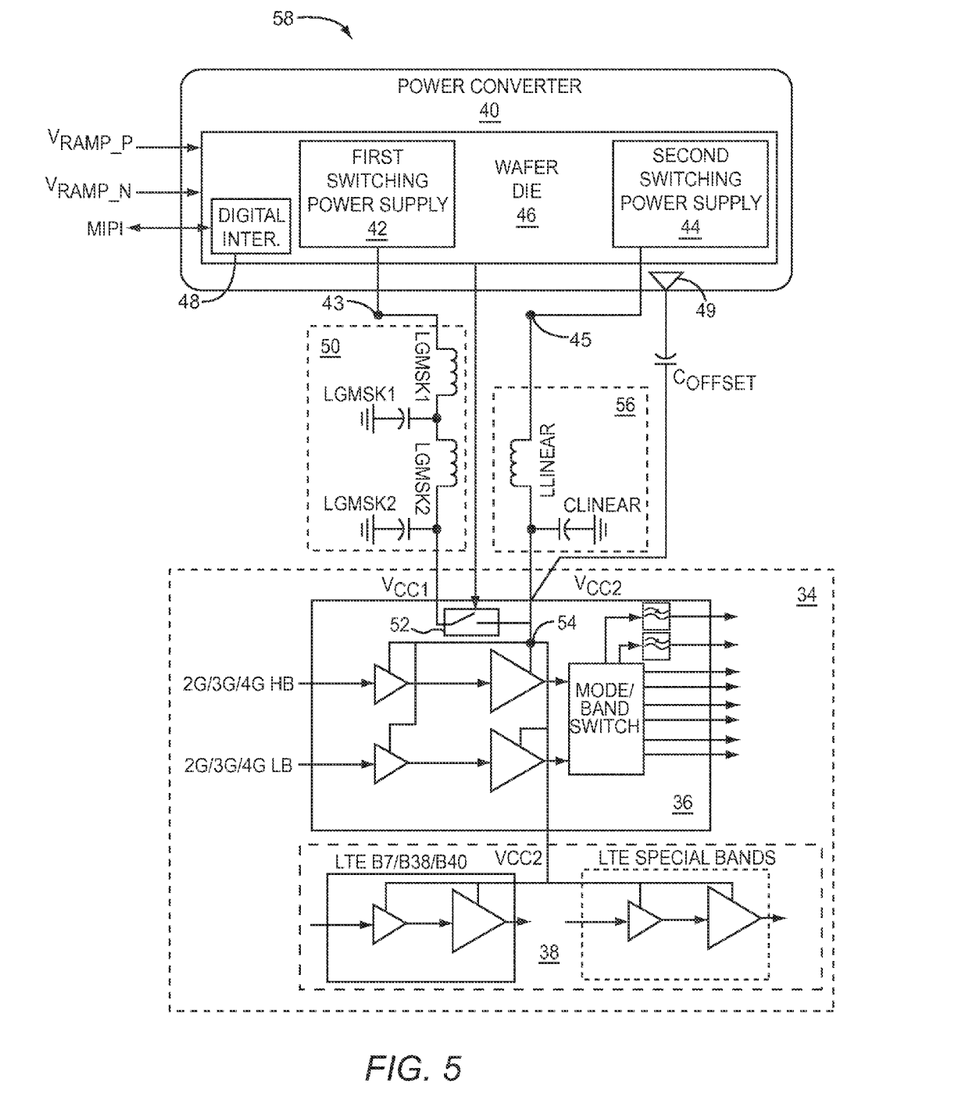
FIG. 5 is a block diagram of another embodiment of a multi-mode/multi-band power management system that is in accordance with the present disclosure.

FIG. 5 is a block diagram of another embodiment of multi-mode/multi-band power management system 58 that is in accordance with the present disclosure. The multi-mode/multi-band power management system 58 adds an offset capacitor $C_{OFFSET}$ to the output of the parallel amplifier 49. The offset capacitor $C_{OFFSET}$ serves two roles. A first role for the offset capacitor $C_{OFFSET}$ is to shift the average voltage at the power supply node 54 to a lower voltage. A second role for the offset capacitor $C_{OFFSET}$ is to increase decoupling for the first switching power supply 42 during the slow DCDC mode while a PA of the RF PA load 34 is operating in saturation mode.

Figure 6:
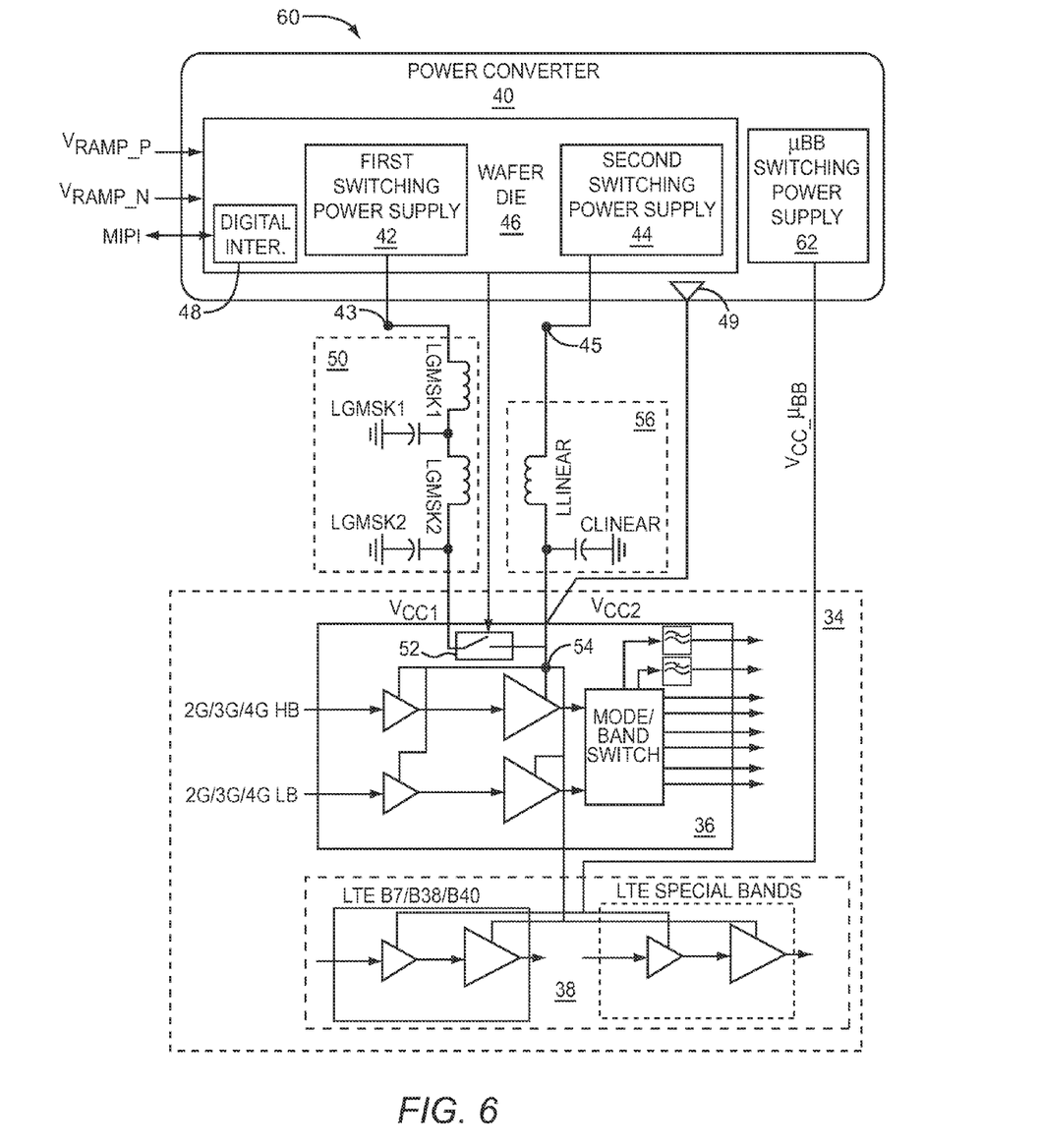
FIG. 6 is a block diagram of yet another embodiment of a multi-mode/multi-band power management system that is in accordance with the present disclosure.

FIG. 6 is a block diagram of yet another embodiment of the multi-mode/multi-band power management system 60 that is in accordance with the present disclosure. In this embodiment, the bolt-on PAs 38 have separate power nodes for pre-amplifier stages and output power amplifier stages. The $V_{CC2}$ node supplies the output stages of the bolt-on PAs 38, while a $V_{CC1\_\mu BB}$ node supplies the pre-amplifier stages. The $V_{CC1\_\mu BB}$ node is coupled to the output of a micro-buck/boost switching power supply 62. The $V_{CC1\_\mu BB}$ node also supplies power to the parallel amplifier 49 to enhance the efficiency of the multi-mode/multi-band power management system 60. Thus, there is no need to add an extra micro-buck/boost switching power supply.

Figure 7:
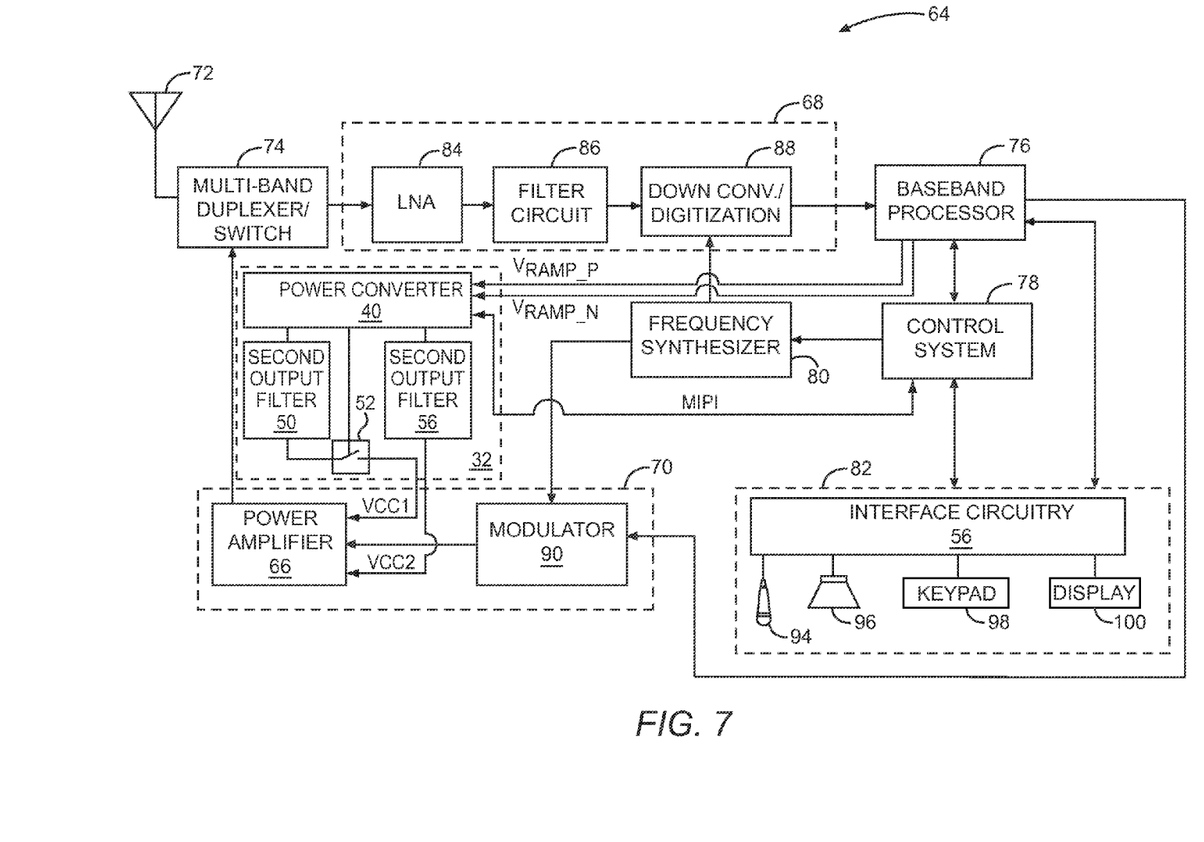
FIG. 7 is a mobile terminal that incorporates the power management system of the present disclosure.

FIG. 7 depicts the basic architecture of user equipment (UE) in the form of a mobile terminal 64 that incorporates an embodiment of the power management system 32 of FIG. 4. In particular, the power management system 32 is usable to supply power to a power amplifier 66 in the mobile terminal 64. The mobile terminal 64 may include a receiver front end 68, a radio frequency (RF) transmitter section 70, an antenna 72, a multi-band duplexer/switch 74, a baseband processor 76, a control system 78, a frequency synthesizer 80, and an interface 82. The receiver front end 68 receives information bearing radio frequency signals from one or more remote transmitters provided by a base station (not shown). A low noise amplifier (LNA) 84 amplifies the signal. A filter circuit 86 minimizes broadband interference in the received signal, while down conversion and digitization circuitry 88 down converts the filtered, received signal to an intermediate or baseband frequency signal, which is then digitized into one or more digital streams. The receiver front end 68 typically uses one or more mixing frequencies generated by the frequency synthesizer 80. The baseband processor 76 processes the digitized received signal to extract the information or data bits conveyed in the received signal. This processing typically comprises demodulation, decoding, and error correction operations. As such, the baseband processor 76 is generally implemented in one or more digital signal processors (DSPs).

On the transmit side, the baseband processor 76 receives digitized data, which may represent voice, data, or control information, from the control system 78, which it encodes for transmission. In a case of envelope tracking, the baseband processor 76 extracts the I/O components of a baseband envelope signal in order to generate a differential $V_{RAMP}$ signal that is applied to the $V_{RAMP\_P}$ and $V_{RAMP\_N}$ terminals of the power converter 40. Moreover, the encoded data is output to the RF transmitter section 70, where it is used by a modulator 90 to modulate a carrier signal that is at a desired transmit frequency. The power amplifier 66 amplifies the modulated carrier signal to a level appropriate for transmission, and delivers the amplified and modulated carrier signal to the antenna 72 through the a power amplifier 66. The control system 78 outputs a MIPI signal that provides instructions and data for the power management system 32 as needed. For example, the control system 78 may instruct the power converter 40 to close the electronic switch 52 in anticipation of a transmission event that will use a PA operating in saturation mode. Alternately, the control system 78 may instruct the power converter 40 to open the electronic switch 52 in anticipation of a transmission event that will use a PA operating in linear mode. In this case, the baseband processor provides to the power converter 40, the power control signal $V_{RAMP}$ that is amplitude modulated in synchronization with the amplitude of a signal that is to be amplified by the RF PA load 34.

A user may interact with the mobile terminal 64 via the interface 82, which may include interface circuitry 92 associated with a microphone 94, a speaker 96, a keypad 98, and a display 100. The interface circuitry 92 typically includes analog-to-digital converters, digital-to-analog converters, amplifiers, and the like. Additionally, it may include a voice encoder/decoder, in which case it may communicate directly with the baseband processor 76. The microphone 94 will typically convert audio input, such as the user's voice, into an electrical signal, which is then digitized and passed directly or indirectly to the baseband processor 76. Audio information encoded in the received signal is recovered by the baseband processor 76, and converted by the interface circuitry 92 into an analog signal suitable for driving the speaker 96. The keypad 98 and the display 100 enable the user to interact with the mobile terminal 64, input numbers to be dialed, address book information, or the like, as well as monitor call progress information.

Those skilled in the art will recognize improvements and modifications to the preferred embodiments of the present disclosure. All such improvements and modifications are considered within the scope of the concepts disclosed herein and the claims that follow.

What is claimed is:

1. A power management system for a radio frequency (RF) power amplifier (PA) load, comprising:
   a first switching power supply adapted to provide a relatively constant DC voltage to the RF PA load, the first switching power supply having an output terminal for coupling a first output filter to the first switching power supply;
   an electronic switch for selectively coupling the first output filter between the first switching power supply and the RF PA load;
   a second switching power supply adapted to provide a dynamic DC voltage to the RF PA load, wherein the dynamic DC voltage is amplitude modulated in synchronization with the amplitude of a transmit signal that is to be amplified by the RF PA load, the second switching power supply having an output terminal for coupling a second output filter between the second switching power supply and the RF PA load; and
   a control system that is adapted to close the electronic switch to supply the relatively constant DC voltage in addition to the dynamic DC voltage to the RF PA load in a first mode and to open the electronic switch wherein the relatively constant DC voltage is not supplied to the RF PA load in a second mode.

2. The power management system of claim 1 wherein the relatively constant DC voltage is based on an expected power output.

3. The power management system of claim 1 wherein the dynamic DC voltage is based on an amplitude of a transmit signal being provided to the RF PA load for amplification.

4. The power management system of claim 1 wherein the relatively constant DC voltage is based on an expected power output and the dynamic DC voltage is based on an amplitude of a transmit signal being provided to the RF PA load for amplification.

5. The power management system of claim 1 wherein the first mode corresponds to the RF PA load operating in saturation when amplifying a transmit signal being provided to the RF PA load.

6. The power management system of claim 1 wherein the second mode corresponds to the RF PA load operating linearly when amplifying a transmit signal being provided to the RF PA load.

7. The power management system of claim 1 wherein the first mode corresponds to the RF PA load operating in saturation when amplifying a transmit signal being provided to the RF PA load and the second mode corresponds to the RF PA load operating linearly when amplifying a transmit signal being provided to the RF PA load.

8. The power management system of claim 1 wherein the first output filter is an LC filter.

9. The power management system of claim 1 wherein the second output filter is an LC filter.

10. The power management system of claim 1 wherein the first switching power supply is a buck/boost type power supply.

11. The power management system of claim 1 wherein the first switching power supply and the second switching power supply are integrated in a single wafer die.

12. The power management system of claim 11 wherein the single wafer die includes a digital interface adapted to receive commands and data from the control system for selecting power levels for the first switching power supply and for controlling the electronic switch.

13. The power management system of claim 1 further including an offset capacitor that is adapted to shift an average voltage at a power supply node to a lower voltage and to increase decoupling for the first switching power supply.

14. A power management system for an RF PA load comprising:
   a first switching power supply adapted to provide a relatively constant DC voltage;
   a second switching power supply adapted to provide a dynamic DC voltage to the RF PA load, wherein the dynamic DC voltage is amplitude modulated in synchronization with the amplitude of a transmit signal that is to be amplified by the RF PA load;
   an electronic switch coupled between the first switching power supply and the RF PA load; and
   a control system that is adapted to close the electronic switch to supply the relatively constant DC voltage in addition to the dynamic DC voltage to the RF PA load in a first mode and to open the electronic switch wherein the relatively constant DC voltage is not supplied to the RF PA load in a second mode, and wherein the relatively constant DC voltage is based on an expected power output, and the dynamic DC voltage is based on an amplitude of a transmit signal being provided to the RF PA load for amplification.

15. The power management system of claim 14 wherein the relatively constant DC voltage is based on an expected power output.

16. The power management system of claim 14 wherein the dynamic DC voltage is based on an amplitude of a transmit signal being provided to the RF PA load for amplification.

17. The power management system of claim 14 wherein the first mode corresponds to the RF PA load operating in saturation when amplifying a transmit signal being provided to the RF PA load.

18. The power management system of claim 14 wherein the second mode corresponds to the RF PA load operating linearly when amplifying a transmit signal being provided to the RF PA load.

19. The power management system of claim 14 wherein the first mode corresponds to the RF PA load operating in saturation when amplifying a transmit signal being provided to the RF PA load and the second mode corresponds to the RF PA load operating linearly when amplifying a transmit signal being provided to the RF PA load.

20. The power management system of claim 14 wherein the relatively constant DC voltage provided to the RF PA load through a first output filter and the dynamic DC voltage is provided to the RF PA load through a second output filter.

21. The power management system of claim 14 further including a first output filter that is an LC filter coupled between the first switching power supply and the electronic switch.

22. The power management system of claim 14 further including a second output filter that is an LC filter coupled between the second switching power supply and the RF PA load.

23. The power management system of claim 14 wherein the first switching power supply is a buck/boost type power supply.

24. The power management system of claim 14 wherein the first switching power supply and the second switching power supply are integrated in a single wafer die.

25. The power management system of claim 24 wherein the single wafer die includes a digital interface adapted to receive commands and data from the control system for selecting power levels for the first switching power supply and for controlling the electronic switch.

26. The power management system of claim 14 further including an offset capacitor adapted to shift an average voltage at a power supply node to a lower voltage and to increase decoupling for the first switching power supply.

27. A method for supplying power to an RF PA load, comprising:
providing a power converter having a first switching power supply to provide a relatively constant DC voltage to the RF PA load and a second switching power supply to provide a dynamic DC voltage to the RF PA load, wherein the dynamic DC voltage is amplitude modulated in synchronization with the amplitude of a transmit signal that is to be amplified by the RF PA load, and an electronic switch for selectively coupling the first switching power supply to the RF PA load through a first output filter, and wherein the second switching power supply is coupled to the RF PA load through a second output filter;
closing the electronic switch to supply the relatively constant DC voltage in addition to the dynamic DC voltage to the RF PA load in a first mode; and
opening the electronic switch to remove the relatively constant DC voltage from the RF PA load in a second mode.

28. The method of claim 27 wherein the relatively constant DC voltage is based on an expected power output.

29. The method of claim 27 wherein the dynamic DC voltage is based on an amplitude of a transmit signal being provided to the RF PA load for amplification.

30. The method of claim 27 wherein the relatively constant DC voltage is based on an expected power output and the dynamic DC voltage is based on an amplitude of a transmit signal being provided to the RF PA load for amplification.

31. The method of claim 27 wherein the first mode corresponds to the RF PA load operating in saturation when amplifying a transmit signal being provided to the RF PA load.

32. The method of claim 27 wherein the second mode corresponds to the RF PA load operating linearly when amplifying a transmit signal being provided to the RF PA load.

33. The method of claim 27 wherein the first mode corresponds to the RF PA load operating in saturation when amplifying a transmit signal being provided to the RF PA load and the second mode corresponds to the RF PA load operating linearly when amplifying a transmit signal being provided to the RF PA load.

34. The method of claim 27 wherein the first switching power supply and the second switching power supply are integrated in a single wafer die.

35. The method of claim 34 wherein the single wafer die includes a digital interface adapted to receive commands and data from a control system for selecting power levels for the first switching power supply and for controlling the electronic switch.

36. The method of claim 27 wherein the power converter further includes a parallel amplifier coupled to a power supply node through an offset capacitor that is adapted to shift an average voltage at the power supply node to a lower voltage and to increase decoupling for the first switching power supply.

* * * * *